United States Patent
Kitano et al.

(10) Patent No.: US 7,857,946 B2
(45) Date of Patent: Dec. 28, 2010

(54) SPUTTERING FILM FORMING METHOD, ELECTRONIC DEVICE MANUFACTURING METHOD, AND SPUTTERING SYSTEM

(75) Inventors: Naomu Kitano, Ichikawa (JP); Naoki Yamada, Fuchu (JP); Takaaki Tsunoda, Kessel-Lo (BE); Nobuo Yamaguchi, Tama (JP); Motomu Kosuda, Machida (JP)

(73) Assignee: Canon Anelva Corporation, Kawasaki-shi (JP)

( * ) Notice: Subject to any disclaimer, the term of this patent is extended or adjusted under 35 U.S.C. 154(b) by 315 days.

(21) Appl. No.: 12/103,813

(22) Filed: Apr. 16, 2008

(65) Prior Publication Data

US 2008/0264775 A1 Oct. 30, 2008

(30) Foreign Application Priority Data

Apr. 26, 2007 (JP) ............................. 2007-116319
Apr. 7, 2008 (JP) ............................. 2008-099786

(51) Int. Cl.
*C23C 14/34* (2006.01)

(52) U.S. Cl. ................. 204/192.12; 204/192.13; 204/192.15; 204/298.03; 204/298.18; 204/298.23; 204/298.26; 204/298.28

(58) Field of Classification Search .......... 204/192.12, 204/192.15, 298.18, 298.23, 298.26, 298.28, 204/298.03, 192.13
See application file for complete search history.

(56) References Cited

U.S. PATENT DOCUMENTS

| 6,716,322 B1 * | 4/2004 | Hedge et al. ............ 204/192.11 |
| 6,783,634 B2 * | 8/2004 | Nozawa et al. ........... 204/192.1 |
| 2006/0134347 A1 * | 6/2006 | Chiruvolu et al. ............ 427/585 |
| 2007/0080059 A1 | 4/2007 | Takahashi .............. 204/298.01 |

FOREIGN PATENT DOCUMENTS

| JP | 49-034573 | 9/1974 |
| JP | 2003-208732 | 7/2003 |
| JP | 2004-508927 | 3/2004 |
| JP | 2004-115861 | 4/2004 |
| JP | 2004-4115861 | 4/2004 |
| JP | 2005008943 | 1/2005 |
| JP | 2005-200682 A | 7/2005 |
| JP | 2007-100183 | 4/2007 |
| KR | 10-1999-0016126 | 4/1999 |
| WO | WO 02/24321 A1 | 3/2002 |
| WO | WO 2004-083481 A1 | 9/2004 |

\* cited by examiner

*Primary Examiner*—Rodney G McDonald
(74) *Attorney, Agent, or Firm*—Fitzpatrick, Cella, Harper & Scinto

(57) ABSTRACT

A sputtering film forming method. which positions a target 4 and 5 at an incline to a surface of a substrate 10 whereupon a film is to be formed, and forms the film upon the surface of the substrate 10 whereupon the film is to be formed in an incline direction while the substrate 10 is rotated about a normal axis, terminates the forming of the film at a predetermined timing from the commencement of the forming of the film, wherein the forming of the film is terminated, when the substrate has rotated by 360 degrees×n+180 degrees+α, where n is a natural number, including 0, and −10 degrees<α<10 degrees.

9 Claims, 11 Drawing Sheets

F I G. 8
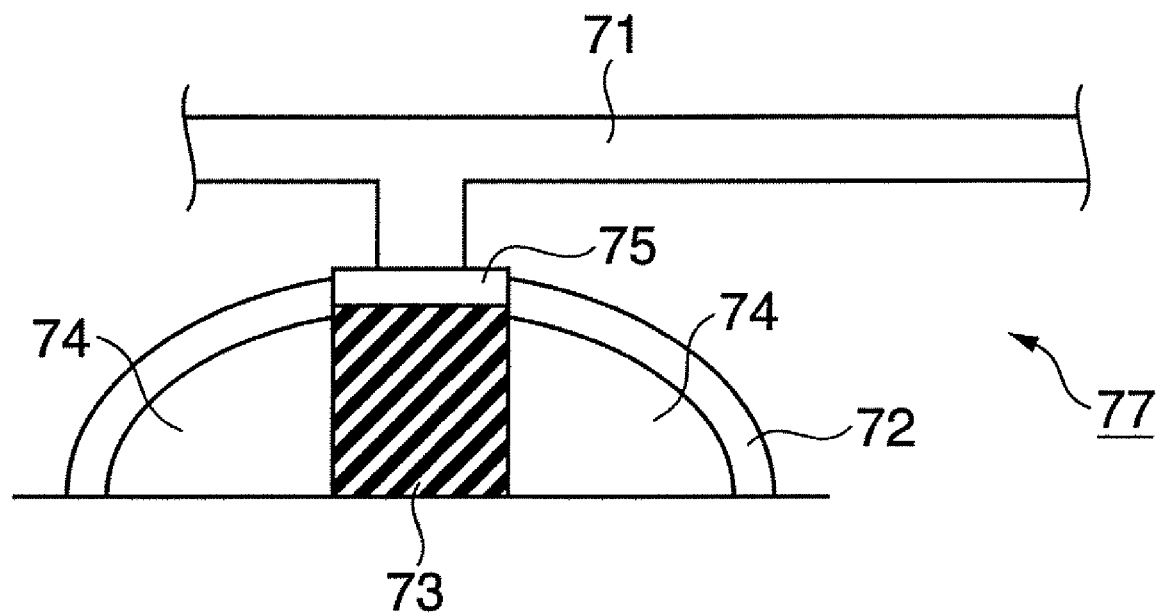

SPUTTERING FILM FORMING METHOD, ELECTRONIC DEVICE MANUFACTURING METHOD, AND SPUTTERING SYSTEM

BACKGROUND OF THE INVENTION

1. Field of the Invention

The present invention relates to a sputtering film forming method for forming a thin film, an electronic device manufacturing method, and a sputtering system, with regard to such as a semiconductor device manufacturing process.

2. Description of the Related Art

A development of a technology for microminiaturization of a semiconductor is being carried out at present at a furious pace, in order to achieve ever-greater speed and ever lower power consumption with LSIs. With regard to a conventional transistor, a silicon nitride film is employed as a gate insulator film thereof, and a polycrystalline silicon film is employed as an electrode thereof. A silicide, which is chemical compound generated by silicon and a metal, is employed for reducing a resistance of a diffused layer and reducing a contact resistance.

In recent times, however, a development is being carried out on a transistor technology that combines a metal gate electrode and a high-k gate dielectric films, in order to keep control of an increase in an electric current leakage, owing to an increasing thinness in the gate dielectric layer, and a decline in an electric current driving force, which is caused by a slight surface depletion of the polycrystalline silicon. Moreover, a search of a new silicide material is being carried out in accordance with a miniaturization of a semiconductor device.

Given such a circumstance, an establishment of a metal/high-k gate stacks manufacturing technology and the silicide manufacturing technology has been desired, one that is primarily capable of a design and a control with a high precision that is required in the development of the preceding transistor technology.

A sputtering system may be cited as an instance of a thin film forming method with regard to such as a semiconductor apparatus. Refer to Japanese Patent Laid Open No. 2005-8943. An instance of a conventional multi-cathode type sputtering system is depicted in FIG. 1.

When using such a system to perform a film thickness design with such as a semiconductor, it is necessary to form an inclining film thickness. In order to perform a film forming that incorporates the inclining film thickness, the conventional apparatus that is depicted in FIG. 1 is employed, and the inclining film thickness is achieved by performing an inclining sputter, wherein a target is put out of parallel to a substrate, and the substrate is anchored in place. A film thickness distribution of a hafnium stack that is obtained in such a manner is depicted in FIG. 2. Furthermore, a technique has been sought such that, in an instance where stack films are formed from two different types of material, a determination is made of a characteristic point so as to form the second layer on the first layer, which is depicted in FIG. 2, in such a manner that the thick of a location of the first layer will correspond to a thinnest location of the second layer. A film thickness distribution of a stack of a hafnium film and a tantalum film that is obtained in such a manner is depicted in FIG. 3.

When performing such a film forming method, however, with respect to the film thickness distribution of each respective monolayer, a contour line that joins a location with an equivalent film thickness ends up forming an arc shape, such as is depicted in FIG. 2, and it has been difficult to obtain a film that comprises a given film thickness incline in only a single direction. Accordingly, when depositing a film that includes an incline of a film thickness in two directions in a plane of the substrate, it has of necessity not been possible to obtain a satisfying film thickness distribution.

Hence, given that the thickness control of the stacked film is insufficient in a circumstance of, for instance, a thin film manufacturing technology of the stack films on an order a plurality of nm, such as the metal/high-k gate stacks, an imprecision arises in the plurality of stacked film thickness. As a result, an impediment arises to an operation that determines a stack construction, which is required for high precision design and control.

SUMMARY OF THE INVENTION

An objective of the present invention is to provide a film forming technology that is suited to determining the stack construction, which is required for high precision design and control, with regard to a sputtering system that sputter forms a film on an incline, while rotating the substrate. More concretely, an objective of the present invention is to provide a film forming technology that facilies obtaining a stack film wherein the film thickness is distributed at a given incline rate, and in a single direction of the substrate.

According to one aspect of the present invention, there is provided a sputtering film forming method, comprising the steps of: positioning a target at an incline to a surface of a substrate whereupon a film is to be formed, and forming the film upon the surface of the substrate whereupon the film is to be formed while the substrate is rotated about a normal axis to the substrate surface; and terminating the forming of the film at a predetermined timing from a commencement of the forming of the film, wherein the forming of the film is terminated, when the substrate has rotated by 360 degrees×n+180 degrees+α, where n is a natural number, including 0, and −10 degrees<α<10 degrees.

According to another aspect of the present invention, there is provided an electronic device manufacturing method, comprising the steps of: a first step of positioning a target at an incline to a surface of a substrate whereupon a film is to be formed, forming the film upon the surface of the substrate whereupon the film is to be formed while the substrate is rotated about a normal axis to the substrate surface, and terminating the forming of the film at a predetermined timing from a commencement of the forming of the film, wherein the forming of the film is terminated, the substrate has rotated by 360 degrees×n+180 degrees+α, where n is a natural number, including 0, and −10 degrees<α<10 degrees; a second step of evaluating a film that is formed in the first step; and a third step of manufacturing an electronic device according to a condition that is evaluated in the second step.

According to still another aspect of the present invention, there is provided a sputtering system configured to position a target at an incline to a surface of a substrate whereupon a film is to be formed, and form the film upon the surface of the substrate whereupon the film is to be formed while the substrate is rotated about a normal axis to the substrate surface, the sputtering system comprising: a rotating drive unit configured to rotate the substrate; an angle of rotation detection unit configured to detect an angle of rotation of the rotating drive unit; and a control unit configured to interrupt a film forming operation, when a rotation of 360 degrees×n+180 degrees+α from a commencement of the forming of the film, where n is a natural number, including 0, and −10 degrees<α<10 degrees, is detected by the angle of rotation detection unit.

According to yet another aspect of the present invention, there is provided a sputtering system configured to position a target at an incline to a surface of a substrate whereupon a film is to be formed, and form the film upon the surface of the substrate whereupon the film is to be formed while the substrate is rotated about a normal axis to the substrate surface, the sputtering system comprising: a rotating drive unit configured to rotate the substrate; a shutter configured to be positioned between the target and the substrate; an open and close drive unit configured to drive an open and close of the shutter; an angle of rotation detection unit configured to detect an angle of rotation of the rotating drive unit; and a control unit configured to drive the open and close drive unit to close the shutter, when a rotation of 360 degrees×n+180 degrees+α from a commencement of the forming of the film, where n is a natural number, including 0, and −10 degrees<α<10 degrees, is detected by the angle of rotation detection unit.

According to the present invention, it is possible to form a film with a given incline rate of the film thickness for a single direction of the substrate, and thus, when forming a stack with two different layers, it is possible to form a stack with a preferred film thickness distribution by adjusting a direction of the incline of the film thickness. Therefore, for instance, even performing a design of an optimal film thickness when stacking different thin films, such as in an electronic device, it is possible to control the film thickness of each respective thin film to a given incline rate, and a highly reliable stack is provided thereby.

It is also possible, with the sputtering film forming method according to the present invention, such that even when performing a design of a device construction from a binary system material, for instance, a design and a control are possible that is highly reliable and that has a high precision.

It is also possible, with the manufacturing method according to the present invention, to use the stack that is distributed over the given incline rate to increase an efficiency of the operation that determines the thin film stacks construction of the device, and thereby significantly improve an efficiency in mass production of an electronic device.

Further features of the present invention will become apparent from the following description of exemplary embodiments, with reference to the attached drawings.

BRIEF DESCRIPTION OF THE DRAWINGS

FIG. 8 is a conceptual configuration diagram that depicts the MOS transistor that is employed according to the third embodiment.

DESCRIPTION OF THE EMBODIMENTS

Figure 1:
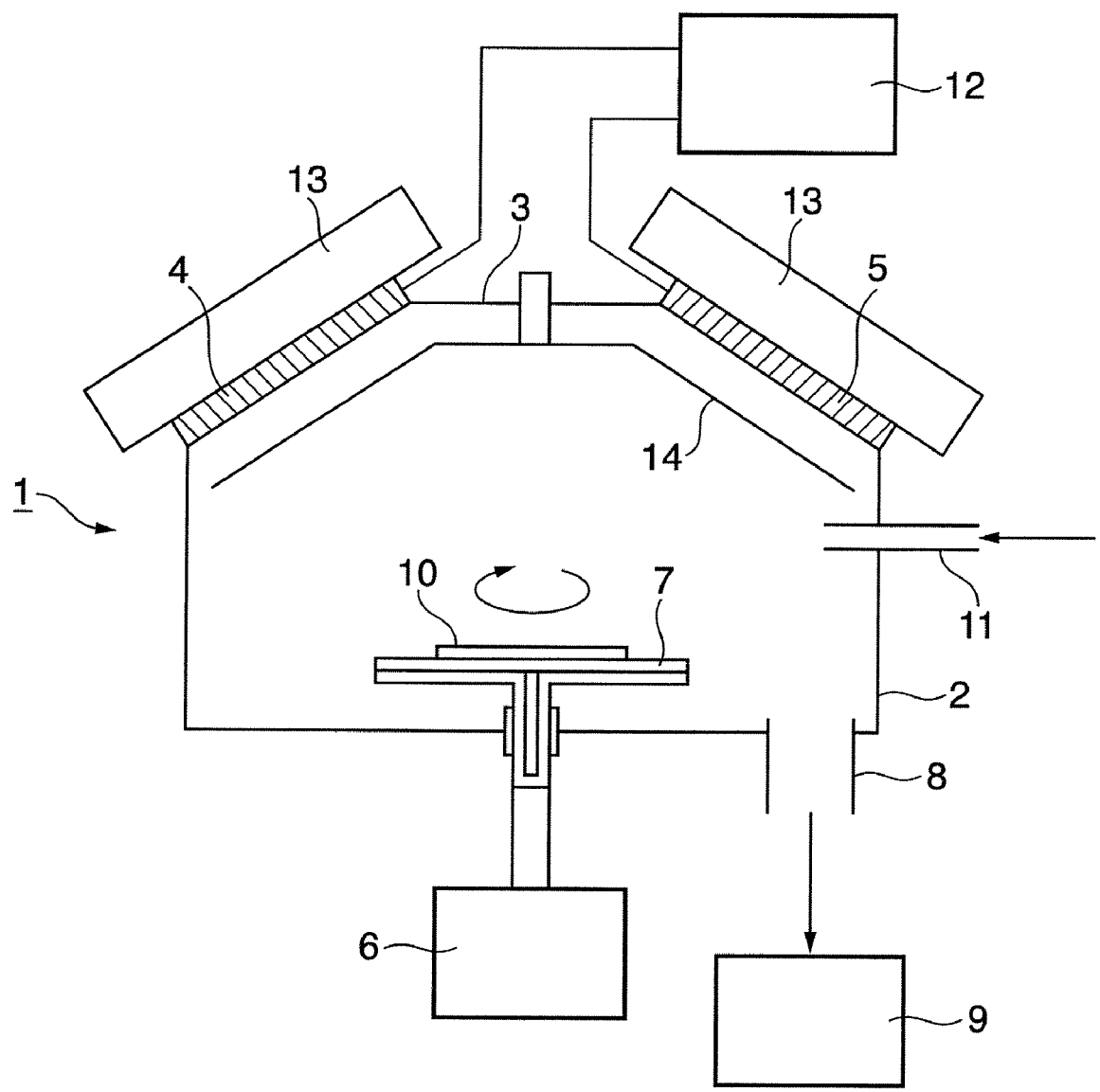
FIG. 1 is a conceptual configuration diagram of an instance of a conventional multi cathode type sputtering system.

The present section begins with a description of a conventional multi cathode type sputter apparatus, with reference to FIG. 1. With regard to the conventional apparatus as depicted in FIG. 1, a ceiling unit 3 of a vacuum receptacle 2 of a film-fabricating chamber 1 comprises two targets 4 and 5. The target 4 and 5 are placed in an inclining state with regard to the ceiling unit 3. A substrate holder 7 is positioned on a center of a bottom unit of the film forming chamber 1, with the substrate holder 7 installed so as to rotate freely by way of a rotating drive mechanism 6, and a substrate 10 is placed upon the substrate holder 7 in such a manner as to maintain the substrate 10 in a horizontal manner thereupon. Accordingly, the substrate 10 will be in a state of longitudinal rotation when the film is formed, owing to a rotation of the substrate holder 7.

An exhaust port 8 is installed in the bottom unit of the vacuum receptacle 2, and an exhaust apparatus 9 is connected to the exhaust port 8, via an exhaust pipe, in order that an exhaust is performed from the exhaust port 8. An exhaust operation by the exhaust apparatus 9 maintains a required vacuum state within the vacuum receptacle 2, preferably an atmospheric pressure level of not more than $10^{-6}$ Pa. As a concrete instance of the exhaust apparatus 9, a configuration thereof includes a main pump, either a cryo-pump or a turbo molecular pump, which is linked via a main valve, and a dry pump, which is linked via a coarse suction valve.

An electrical discharge is generated within the vacuum receptacle 2 of the film-fabricating chamber 1 that produces plasma, in order to selectively perform a sputtering on either the target 4 or 5. An argon (Ar) gas is supplied, as an instance of an electrical discharge gas, i.e., a process gas or a sputter gas, which generates the electrical discharge, from a gas supply unit 11. An installation location of the gas supply unit 11 is not restricted to a location that is depicted in the drawing.

With regard to the ceiling unit 3 of the vacuum receptacle 2, each respective target 4 and 5 is placed in a position such that each respective target 4 and 5 faces an upper surface, i.e., a surface whereupon the film is to be formed, of the substrate 10, which is placed horizontally below each respective target 4 and 5, at a prescribed angle.

Given that the target 4 and 5 are positioned at an incline to the surface whereupon the film is to be formed of the substrate 10, a normal of a surface of the target 4 and 5 is inclined by only a prescribed angle to a normal of the surface whereupon the film is to be formed of the substrate 10. Put another way, a sputtering particle that proceeds from the target 4 and 5 to the substrate 10 are incident at an incline to the substrate 10.

In FIG. 1, a DC power supply 12 is connected to each of the target 4 and 5, and a prescribed voltage is applied selectively from the DC power supply 12 to each of the target 4 and 5. Put another way, the target 4 and 5 configure a cathode unit. The power supply that is connected to the target 4 and 5 is not restricted to a DC power supply, and it would be permissible for the power supply that is connected to the target 4 and 5 to be an RF power supply that supplies 13.56 MHz, for instance.

Furthermore, a magnet unit 13 is positioned at a back of the target 4 and 5. It would be permissible for the magnet unit 13 to be an electromagnet, a permanent magnet, or a combination thereof. A specified magnetic field distribution is formed upon an inner surface of the target 4 and 5 by the magnet unit 13.

When employing either of the two targets 4 and 5 to perform the sputtering film forming, a necessary target is maintained at a prescribed voltage by the DC power supply 12 and the magnet unit 13, and forms the prescribed magnetic field distribution upon the target surface. It is thus possible to perform a low-pressure discharge sputtering.

A shutter mechanism 14, which is installed to rotate freely, is positioned between the two targets 4 and 5 and the substrate 10, and an open and close operation of the shutter mechanism 14 selects which target of the two targets 4 and 5 is used in the sputtering film forming. It is possible to employ an arbitrary mechanism that is conventionally known as the shutter mechanism 14. The configuration achieves the inclined incidence of a target substance, i.e., a film forming substance, on the substrate 10.

Figure 4:
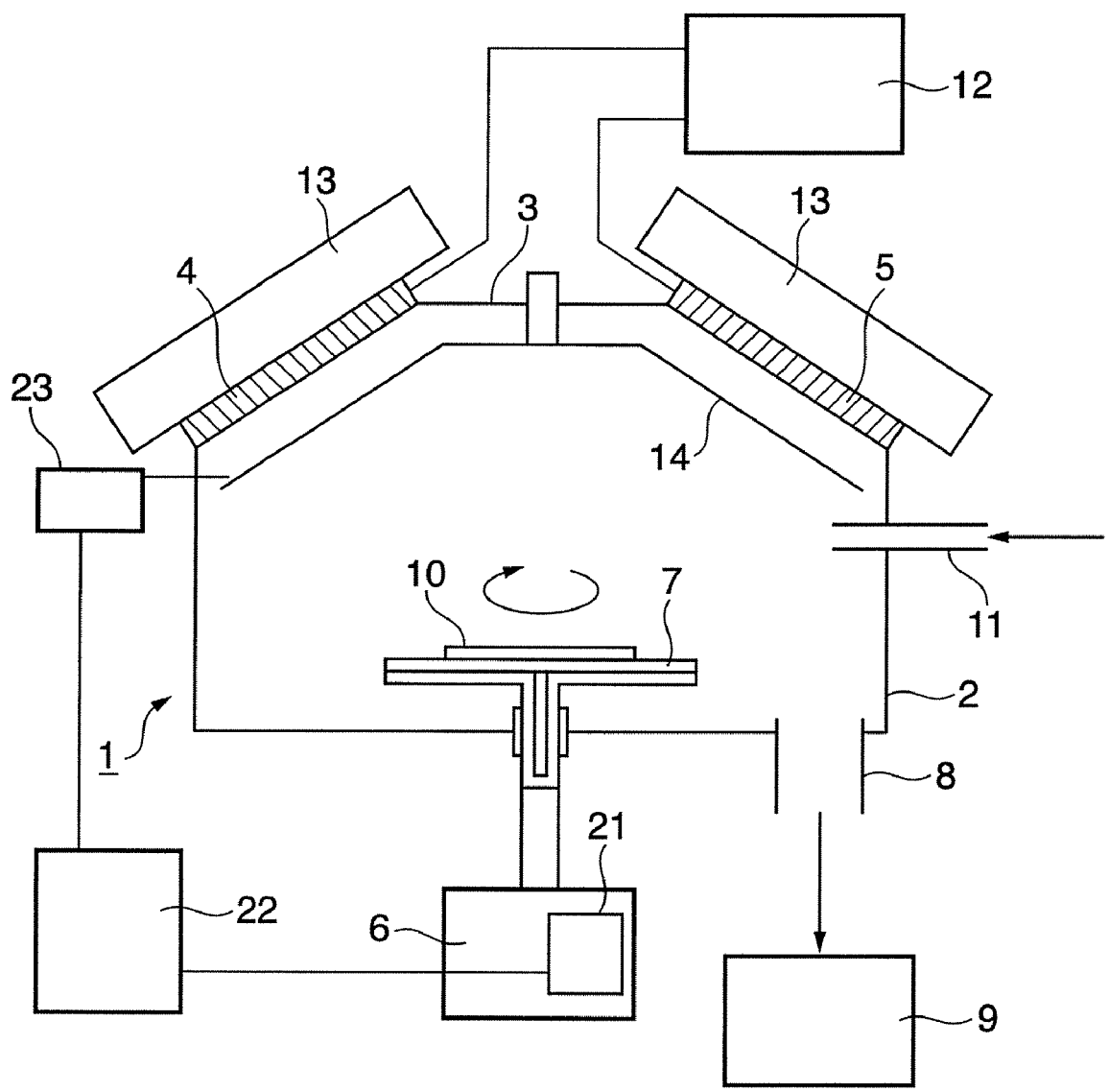
FIG. 4 is a conceptual configuration diagram of an instance of a multi cathode type sputter apparatus that would be capable of carrying out a film forming method according to the present invention.

The film forming method according to the present invention is capable of being carried out by employing a multi cathode type sputtering system, as depicted in FIG. 4. A description will be made of a film forming process according to the present invention wherein the multi cathode type sputtering system is thus employed.

Following is a description of a multi cathode type sputtering system that would be capable of carrying out a film forming method according to the present invention, with reference to FIG. 4.

FIG. 4 depicts a conceptual configuration of a multi cathode type sputtering system that would be capable of carrying out a film forming method according to the present invention.

The sputtering system that is depicted in FIG. 4 adds a control system to the conventional sputtering system that is depicted in FIG. 1, wherein the control system thus added is for terminating at a predetermined timing from a commencement of the forming of the film wherein the substrate 10 has rotated by 360 degrees×n+180 degrees+α, where n is a natural number, including 0, and −10 degrees<α<10 degrees. Specifically, a rotating drive mechanism 6 that causes the substrate 10 to rotate, a shutter open and close drive unit 23 that drives an opening and a closing of the shutter mechanism 14, an angle of rotation detection unit 21, and a control unit 22, have been added to the sputtering system that is depicted in FIG. 4, such that the control unit 22 causes the shutter open and close drive unit 23 to close the shutter mechanism 14 when the angle of rotation detection unit 21 detects a rotation of 360 degrees×n+180 degrees+α, where n is a natural number, including 0, and −10 degrees<α<10 degrees.

The angle of rotation detection unit 21 detects an angle of rotation with a high degree of precision, by using such as an optical sensor to detect a slit that is positioned equidistantly and radially on an axis of rotation of the rotating drive mechanism 6, and outputs a detection signal to a computation unit such as a computer, i.e., the control unit 22. When the angle of rotation as detected by the angle of rotation detection unit 21 is 360 degrees×n+180 degrees+α, where n is a natural number, including 0, and −10 degrees<α<10 degrees, The shutter open and close drive unit 23 drives a servomotor, thus driving the shutter to either an open or a closed position, in response to an external control signal. After the prescribed angle has been detected, the computation unit, i.e., the control unit 22, achieves the shutter close operation at a prescribed substrate rotation placement by sending a control signal to close to the shutter driving mechanism.

It is to be understood that it would be permissible to configure the control unit 22 such that the control unit 22 would interrupt the film forming operation when a rotation of 360 degrees×n+180 degrees+α, where n is a natural number, including 0, and −10 degrees<α<10 degrees, is detected by the angle of rotation detection unit 21. Specifically, in such a circumstance, the control unit 22 would interrupt the application of voltage from the DC power supply 12 to the target 4 and 5 that are connected thereto.

When performing the forming of the film according to the present invention with regard to the apparatus depicted in FIG. 4, the atmospheric pressure within the vacuum receptacle 2 of the film forming chamber 1 is reduced to a low pressure level, one of either of the target 4 and 5 is selected by the shutter mechanism 14, the electric discharge gas is supplied, the sputtering is performed, and the prescribed film is deposited upon the surface whereupon the film is to be formed of the substrate 10. It is presumed that the substrate 10 rotates 360 degrees×n+180 degrees+α, where n is a natural number, including 0, and −10 degrees<α<10 degrees, longitudinally from the commencement of the forming of the film to the termination thereof. Specifically, for instance, a notch is made in a rim portion of the substrate 10 as a point of a commencement of the sputtering, the sputtering commences at a predetermined timing when the notch passes a prescribed position as a point of commencement, and the sputtering terminates when the notch passes a position that is rotated by 180 degrees from the point of commencement in the direction of the rotation as a point of termination. In such a circumstance, it is all the same whether the substrate rotates only by 180 degrees, whether the substrate makes one or more full circle rotations, i.e., of 360 degrees, or whether the substrate rotates by 180 degrees in addition to making a plurality of full circle rotations.

It is to be understood that, when forming the stack films of two or more layers according to the present invention, the position of the notch of the substrate 10 is established, and the sputtering of the second layer is performed such that the thickest region of the film of the second layer is deposited upon the thinnest region of the film that is obtained for the first layer. With either of the sputtering, it is presumed that the rotation of the substrate from the commencement of the sputtering to the termination thereof is 180 degrees. It is to be understood that the 180-degree rotation of the substrate does not strictly mean 180 degrees, and an effective half of a rotation is included therein. For instance, it would be sufficient to satisfy the condition of 360 degrees×n+180 degrees+α, where n is a natural number, including 0, and −10 degrees<α<10 degrees.

First Embodiment

The sputtering system that is depicted in FIG. 4 is employed to form a hafnium monolayer film.

As the substrate 10, a φ 200 mm silicon (Si) wafer is placed upon the substrate holder 7, and the atmospheric pressure with the vacuum receptacle 2 is reduced to 0.02 Pa. A hafnium target is selected with the shutter mechanism 14, the argon (Ar) gas is supplied as the electric discharge gas to the vacuum receptacle 2 at 44.6 mg/min., and the sputtering is performed.

In such a circumstance, the notch is made in the rim portion of the wafer as a point of a commencement of the sputtering, the sputtering commences at a predetermined timing when the notch passes a prescribed position as a point of commencement, and the sputtering terminates when the notch passes a position that is rotated halfway round in a circular path direction from the point of commencement. A speed of rotation of the wafer was 2 rpm. It was presumed that the electrical power that was applied to the target was 100 watts, in order that the thickness of the hafnium film would be 10 nm at a center of the substrate 10.

Figure 5:
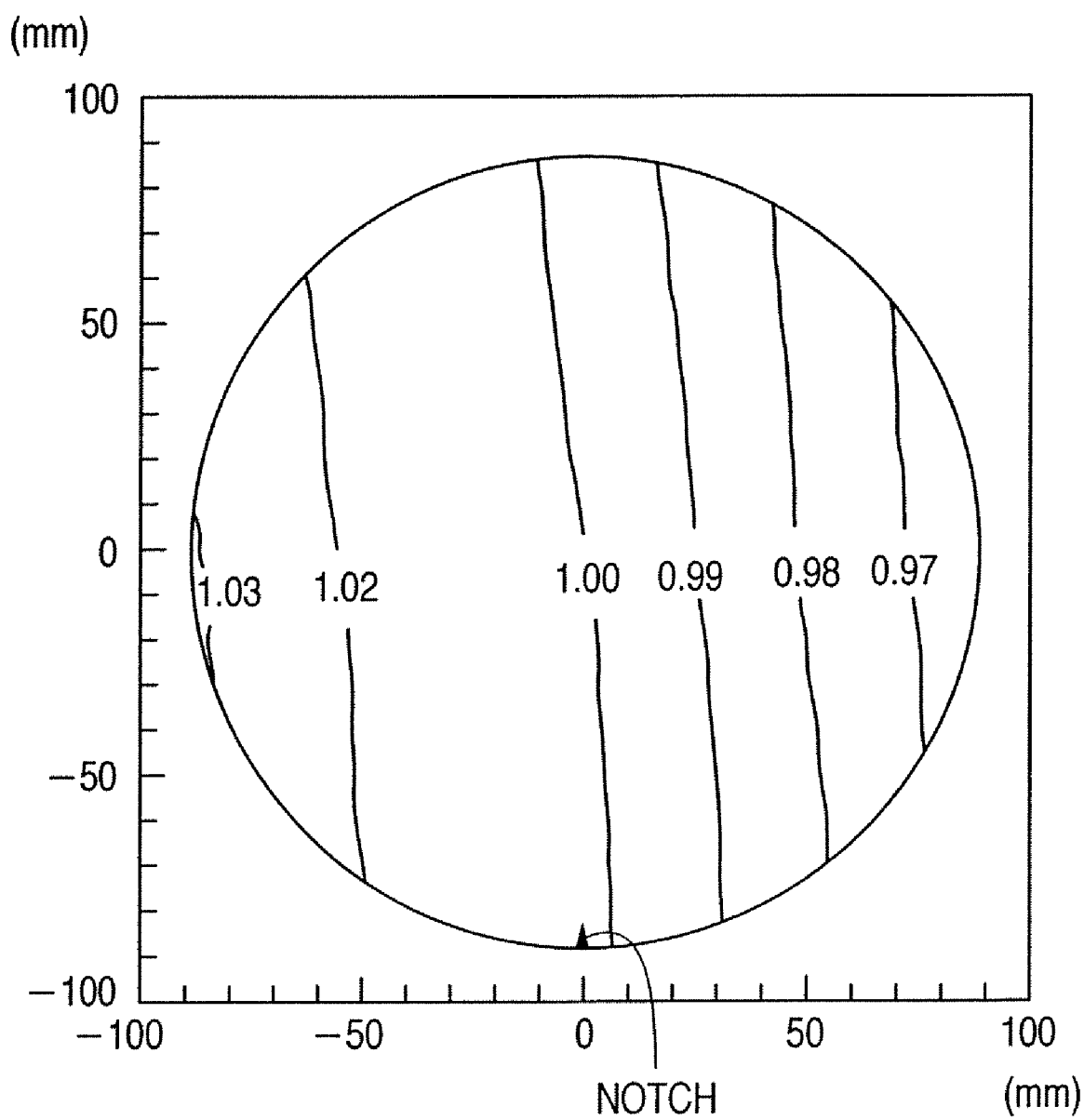
FIG. 5 depicts a film thickness distribution of a hafnium film that is formed according to a first embodiment.

The distribution of the thickness of the hafnium film thus obtained is measured by elipsometry, and a result thereof is depicted in FIG. 5. The notch is formed in a lower edge portion of a circle that is depicted in the drawing, and it is verified that the film thickness is deposited at a given incline rate along a line that is tangential to the substrate 10 that passes through the notch and that is in a parallel direction upon the substrate 10, i.e., in a direction that is approximately orthogonal to the tangent line, and that each respective contour line that joins a location that incorporates an equivalent film thickness is respectively a straight line that is parallel to each respective other such contour line.

Second Embodiment

The sputtering system that is depicted in FIG. 4 is employed to form the stacked films of a hafnium film and a tantalum film.

In order that a thickest region of the tantalum film is deposited upon a thinnest region of the hafnium film that is formed according to the first embodiment, the placement of the notch on the wafer is established, a tantalum target is selected with the shutter mechanism 14, the argon (Ar) gas is supplied at 44.6 mg/min., and the sputtering is performed. It was presumed that the electrical power that was applied to the target was 100 watts, in order that the thickness of the tantalum film would be 10 nm at the center of the substrate 10. The stacked film, wherein the tantalum film is stacked upon the hafnium film, is obtained thereby.

Figure 6:
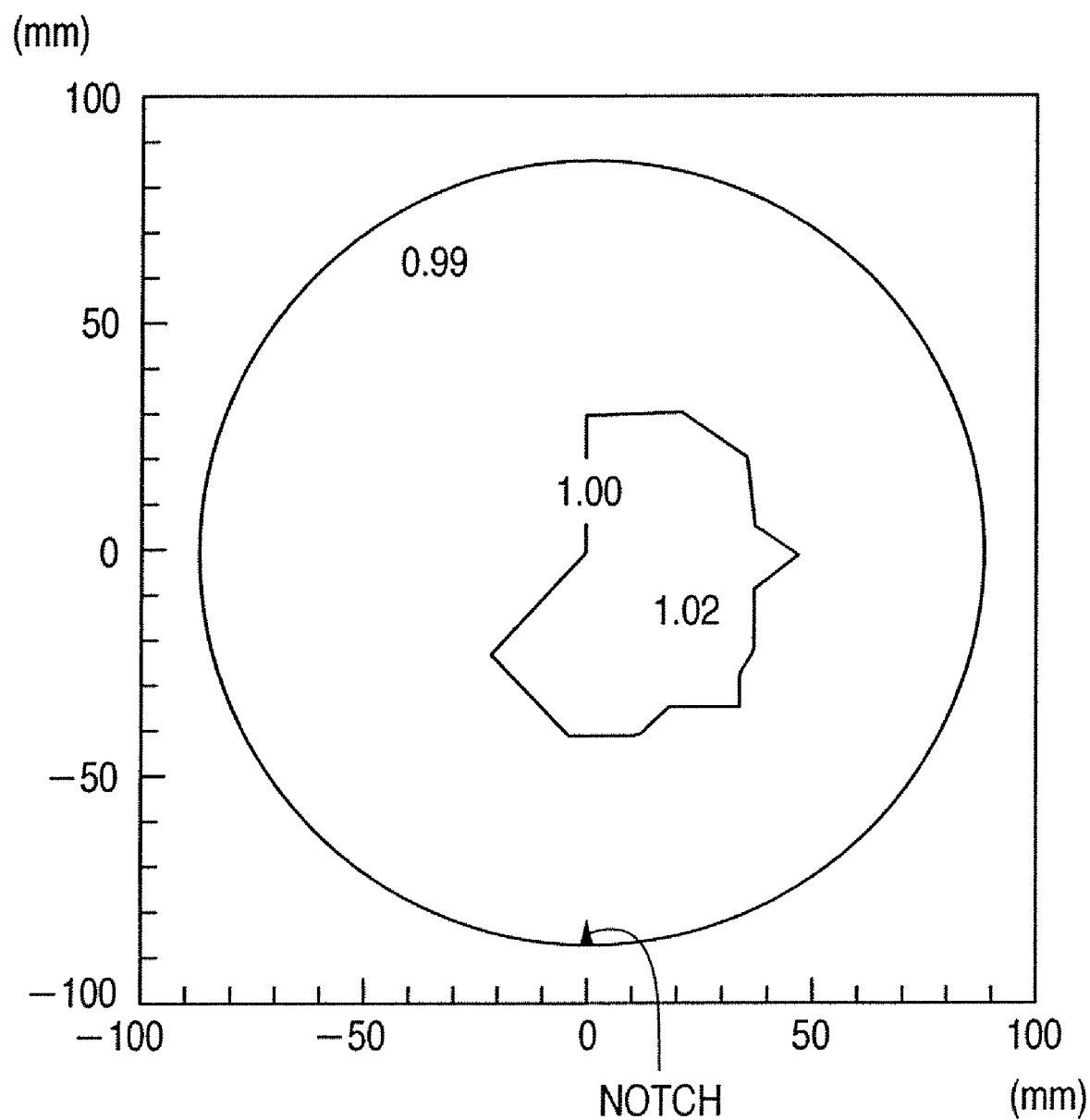
FIG. 6 depicts a film thickness distribution of the film stacks of a hafnium film and a tantalum film that are formed according to a second embodiment.

The distribution of the thickness of the stacked films thus obtained are measured by elipsometry, and a result thereof is depicted in FIG. 6. The thickness distribution thus obtained was a highly desirable value of plus or minus 0.42%, despite the hafnium film and the tantalum film being stacked in such a manner that the film thickness is given an incline.

Put another way, both the hafnium film and the tantalum film incorporate a given incline of the film thickness in a single direction of the substrate, and, consequently, a desirable film thickness may be obtained even when the tantalum film is deposited upon the hafnium film. Therefore, for instance, even performing a design of an optimal film thickness when stacking different thin films, such as in an electronic device, it is possible to control the film thickness of each respective thin film to a given incline rate, and a highly reliable stack is provided thereby.

First Comparative Example

Figure 2:
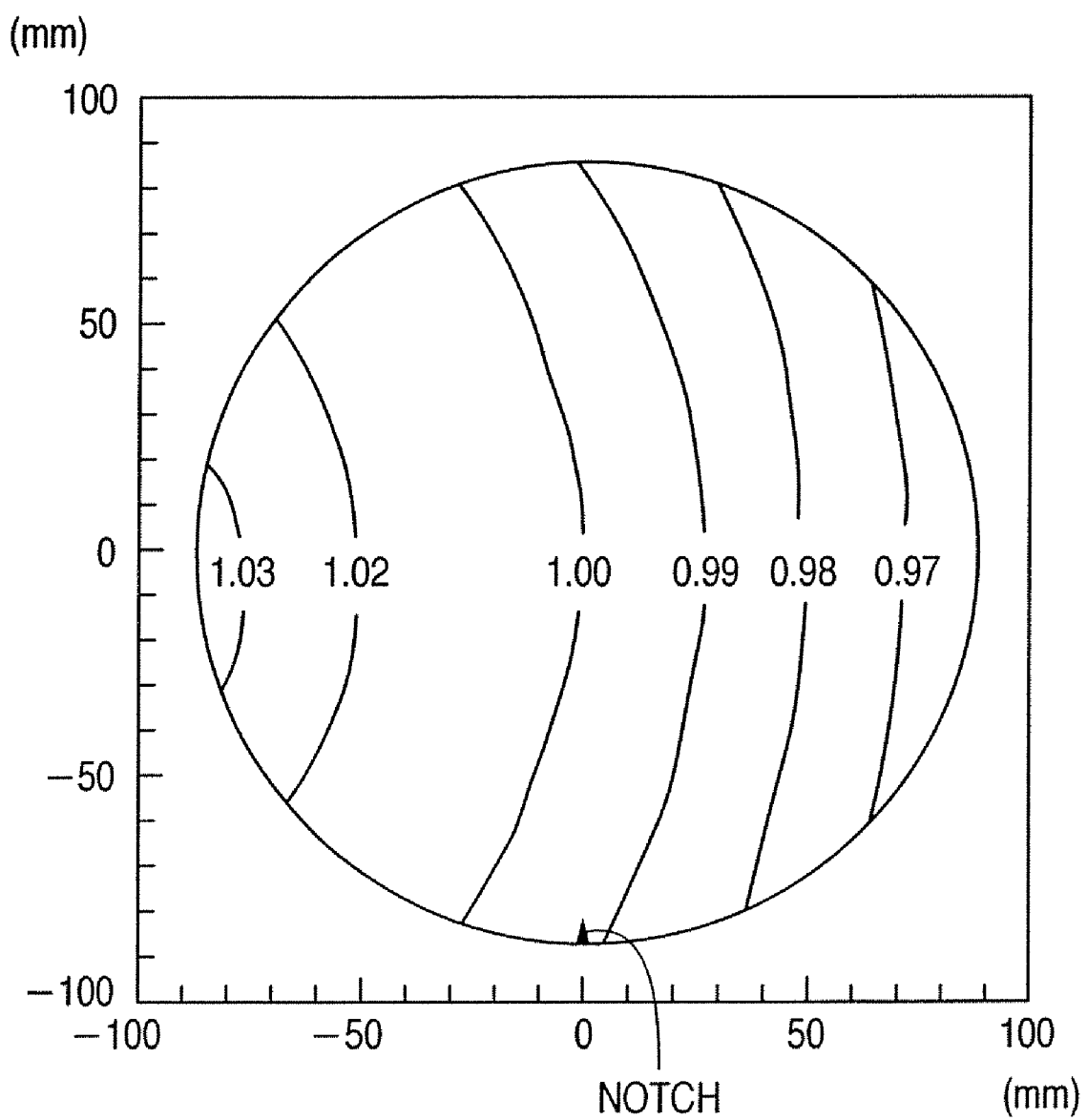
FIG. 2 depicts a film thickness distribution of a hafnium film stack that is formed by a conventional technology and a first comparative example.
Figure 3:
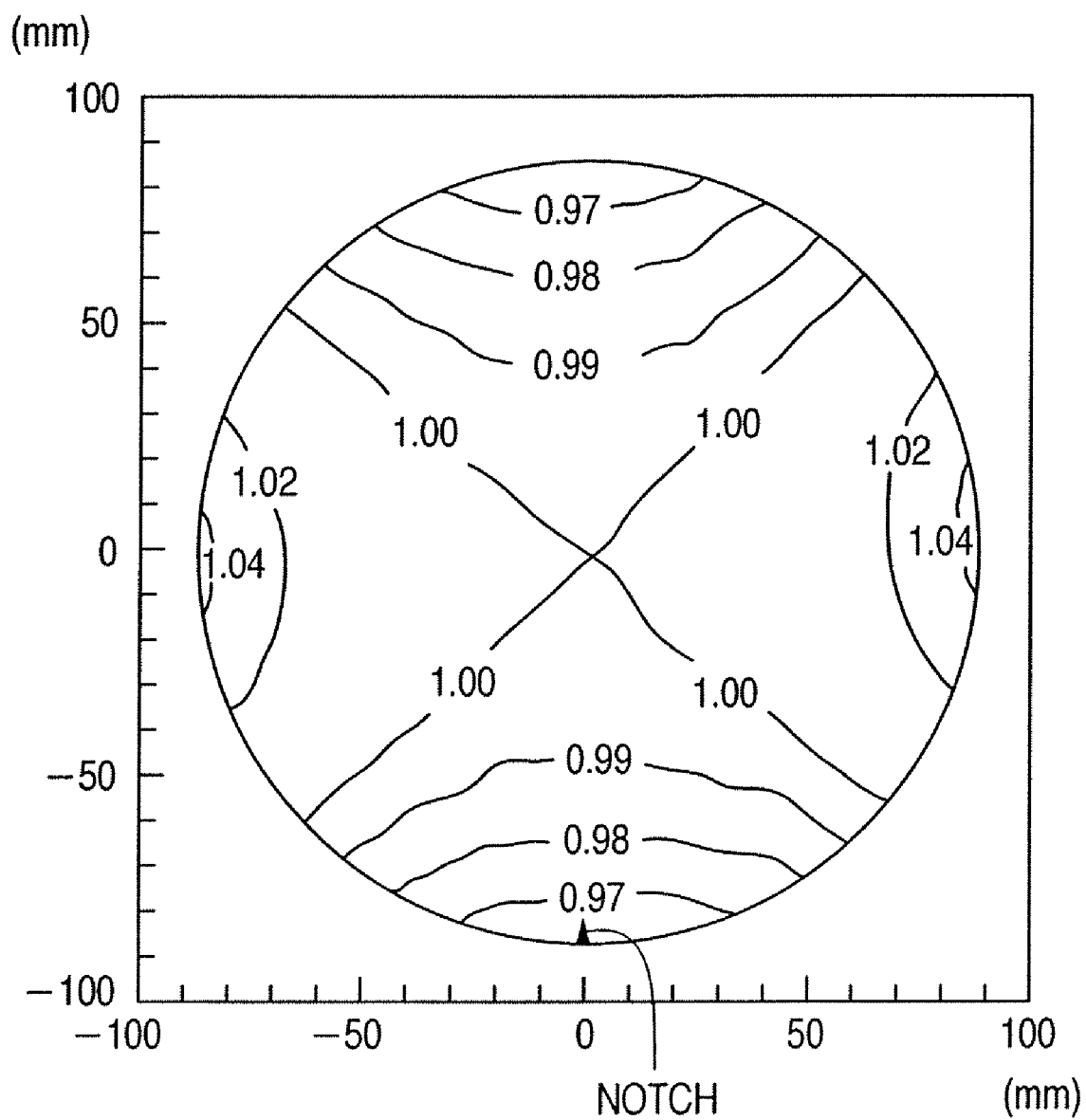
FIG. 3 depicts a film thickness distribution of the film stacks of a hafnium film and a tantalum film that are formed by the conventional technology and the first comparative example.

The conventional sputtering apparatus that is depicted in FIG. 1 is employed to form both a hafnium monolayer film and a stacked film of a hafnium film and a tantalum film. The distribution of the thickness of both the hafnium film and the stacked film of the hafnium film and the tantalum film thus created is measured by elipsometry, and a result thereof is depicted in FIG. 2 and FIG. 3. With respect to the film thickness distribution of the first hafnium film, a contour line that joins a location with an equivalent film thickness ends up forming an arc shape, such as is depicted in FIG. 2. A similar trend emerges even with the second tantalum film, and thus, the film thickness of the stack ends up as a complex distribution, with an incline that traverses four directions, such as is depicted in FIG. 3. The distribution of the film thickness of the stack according to the present example was plus or minus 3.80%.

Third Embodiment

Following is a description of an electronic device that would be applicable to the present invention, with reference to the attached drawings.

Figure 7:
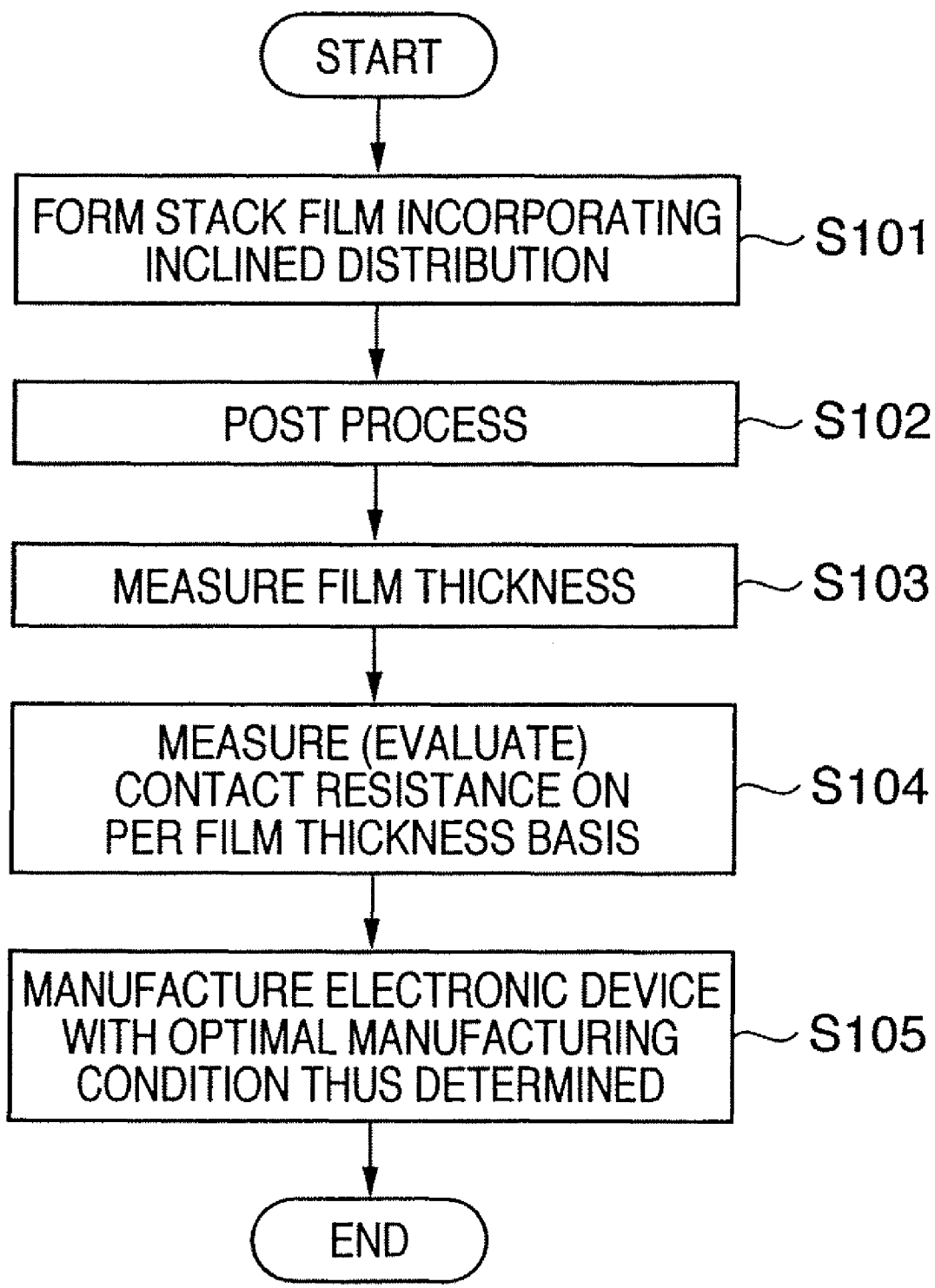
FIG. 7 is a flowchart that depicts a device manufacturing method according to a third embodiment.
Figure 9:
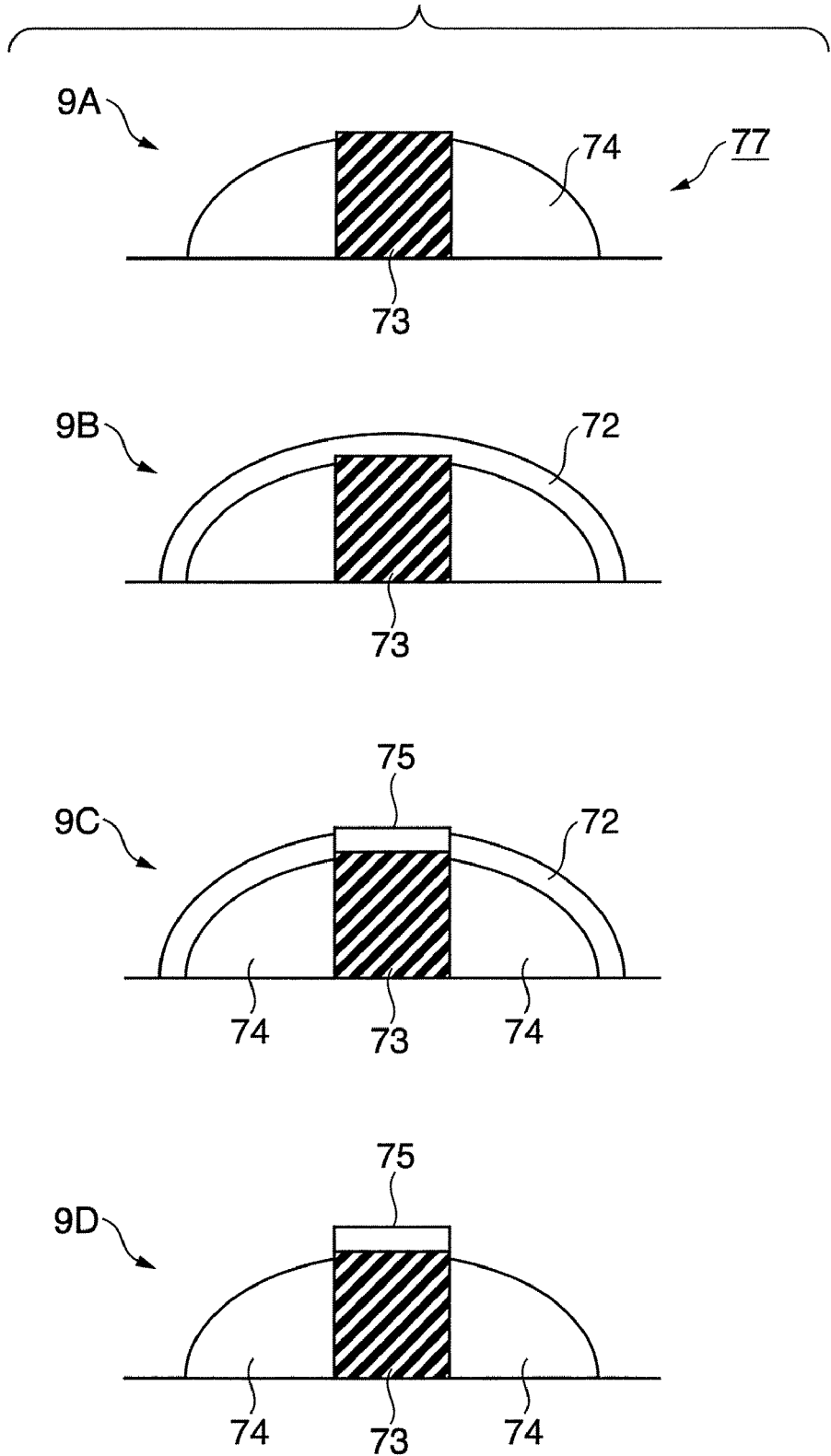
FIG. 9 depicts a process of manufacturing the MOS transistor that is employed according to the third embodiment.

FIG. 7 is a flowchart that depicts an electronic device manufacturing method according to a third embodiment. FIG. 8 is a conceptual configuration diagram that depicts the MOS transistor 77 that is employed according to the third embodiment. FIG. 9 is a conceptual configuration diagram of the MOS transistor 77 that is employed according to the third embodiment at each respective process of manufacturing.

In order to minimize a contact resistance between a gate electrode 73 and a wire to the gate electrode 71 of the MOS transistor that is depicted in FIG. 8, it is necessary to install a chemical compound 75 of nickel, platinum, and silicon (hereinafter nickel platinum silicide film 75). Given that an optimal proportion of a mixture of the nickel and the platinum with regard to a dual layer film of both nickel and platinum that is formed upon the MOS transistor 77, i.e., a nickel platinum film 72, will vary depending upon an operating environment of a semiconductor device, such as a usage temperature or an operating voltage thereof, or else depending upon a design requirement of the semiconductor device, such as a dimension of the gate electrode thereof, it is necessary to determine the optimal proportion of the mixture thereof depending on the device. A sequence such as the following is performed with regard to performing the determination thereof.

(First Step)

Figure 10:
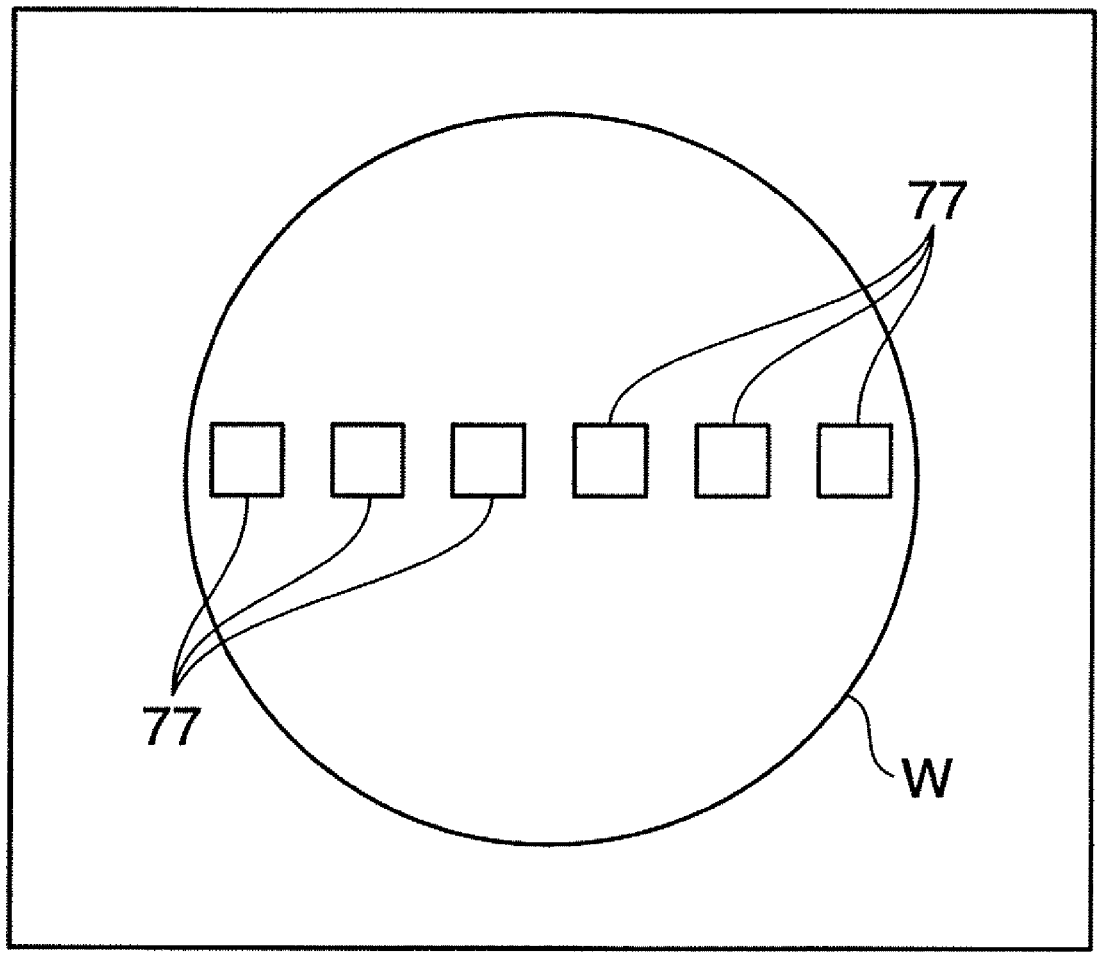
FIG. 10 depicts an evaluation wafer that is employed according to the third embodiment.

In step S101 of FIG. 7, a deposit film is formed that incorporates an inclining film thickness. First, an evaluation wafer W (see FIG. 10) is prepared, wherein the MOS transistor 77 (see 9A in FIG. 9), which incorporates a polysilicon electrode (gate electrode) 73, and a nickel silicide (NiSi) film 74 that is positioned on either side of the polysilicon electrode (gate electrode) 73, is positioned in a line of six locations upon the evaluation wafer W.

Figure 11:
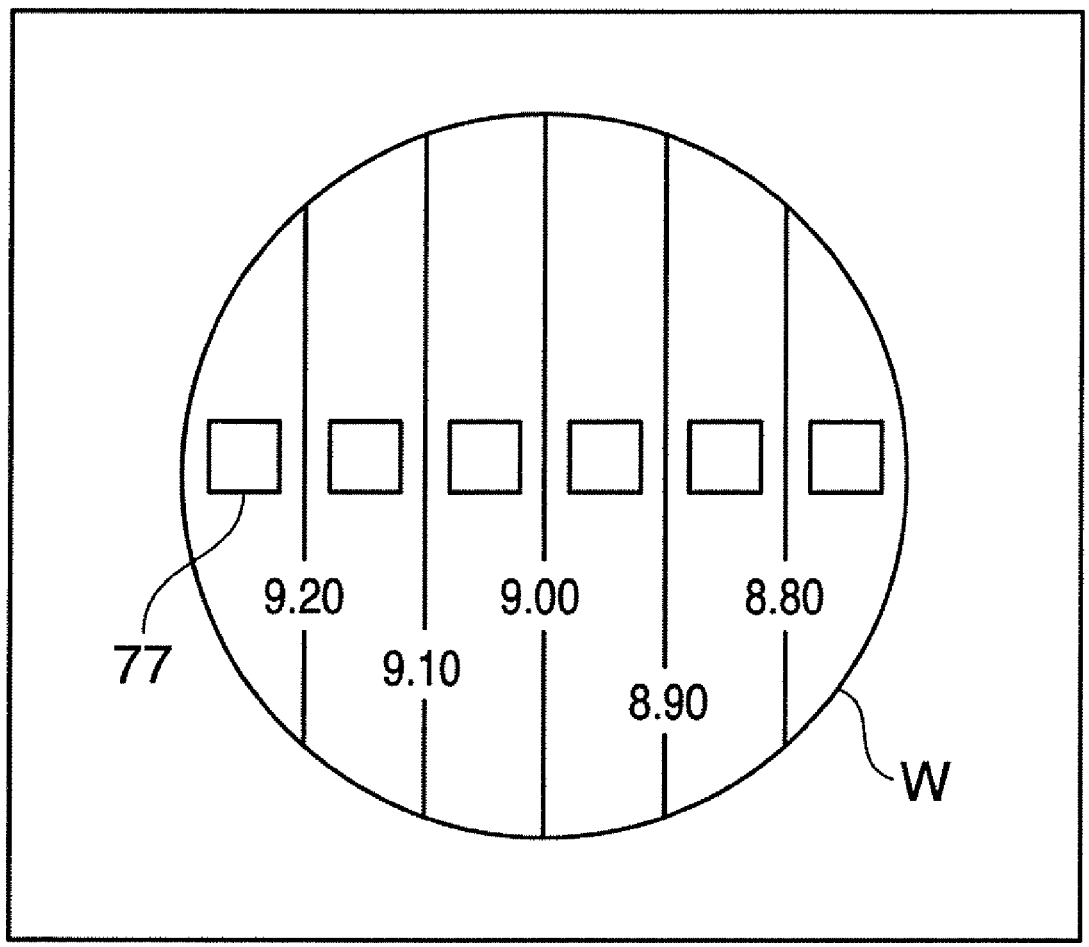
FIG. 11 is a diagram wherein an incline film is formed on the evaluation wafer that is employed according to the third embodiment.

Next, a nickel film with an inclined film thickness is deposited upon the evaluation wafer. In such a circumstance, the sputtering manufacturing apparatus that is depicted in FIG. 4 is employed, positioning the target at an incline to the surface whereupon the film is to be formed of the evaluation wafer, and the film is formed at an inclined direction while the substrate is longitudinally rotated, wherein the forming of the film terminates at a predetermined timing from a commencement of the forming of the film, wherein the substrate has rotated by 360 degrees×n+180 degrees+α, where n is a natural number, including 0, and −10 degrees<α<10 degrees. As per the evaluation wafer W that is depicted in FIG. 11, the nickel thin film is created upon the MOS transistor 77 that is positioned in the six locations, with a film thickness that is inclined at 9.20 nm, 9.10 nm, 9.00 nm, 8.90 nm, and 8.80 nm, respectively.

A speed of rotation of the wafer was 2 rpm in the present circumstance. It was presumed that the electrical power that was applied to the target was 100 watts, in order that the thickness of the nickel film would be 10 nm at a center of the substrate 10. In the present circumstance, it was presumed that the flow rate of the argon gas that was supplied to the vacuum receptacle 2 was 89.3 mg/min.

The platinum thin film is formed upon the nickel thin film that incorporates the inclined film thickness. In such a circumstance, it is presumed that the sputtering commences at a predetermined timing when the notch rotates by a further 180 degrees in the direction of the rotation from the point of commencement of the forming of the nickel film as a point of commencement, and the sputtering terminates when the notch passes a position that is rotated by a half rotation in the direction of the rotation from the point of commencement. A thickest region of the platinum film is deposited upon a thinnest region of the nickel film according to the present method. Put another way, the platinum thin film is deposited with an inclined film thickness of 0.80 nm, 0.90 nm, 1.00 nm, 1.10 nm, and 1.20 nm is deposited upon the nickel thin film with the film thickness that is inclined at 9.20 nm, 9.10 nm, 9.00 nm, 8.90 nm, and 8.80 nm. It is thus possible to form a two layer film of nickel and platinum, i.e., a nickel platinum film 72, upon the MOS transistor 77, as depicted in 9B of FIG. 9.

(Second Step)

In step S102 that is depicted in FIG. 7, a post process is performed upon the two layers film of nickel and platinum, i.e., the nickel platinum film 72, that is formed in the preceding step S101.

Specifically, the nickel platinum silicide film 75, such as is depicted in 9C of FIG. 9, is formed by anneal processing the semiconductor wafer of the two layer film, i.e., the nickel platinum film 72, and by causing the nickel platinum film 72 that is formed upon the semiconductor wafer and the polycrystalline silicon electrode (gate electrode) 73 to chemically react.

Furthermore, taking advantage of a fact that the nickel platinum film 72 does not react chemically with the $SiO_2$ 74 even in a high temperature environment, the non-reactive nickel platinum film 72 that is upon the $SiO_2$ 74, such as is depicted in 9C of FIG. 9, is removed with a compound of sulfuric acid and hydrogen peroxide, such as is depicted in 9D of FIG. 9, thus creating the nickel platinum silicide film 75. It is to be understood that a solvent that removes the non-reactive nickel platinum film 72 is not restricted to the compound of sulfuric acid and hydrogen peroxide, and that such as a compound of sulfuric acid and hydrochloric acid would be permissible.

In step S103, an X-ray fluorescence analysis is used to measure the film thickness longitudinally upon the wafer of the two layer nickel and platinum films of the nickel platinum silicide film 75 thus created, and a ratio of the film thickness, i.e., a mixing ratio, longitudinally upon the wafer of the two layer nickel and platinum films is measured thereby. A result thus measured is depicted in FIG. 11.

In step S104, an electrode is formed upon the nickel platinum silicide film 75 that is formed by the preceding process, and the contact resistance of the transistor of each respective film thickness is measured and evaluated.

As a result, the portion with the film thickness of 9 nm for the nickel film and 1 nm for the platinum film denotes the lowest value of the contact resistance of the nickel platinum silicide film 75, and another portion with a different film thickness denotes a high resistance value. The preceding evaluation sequence denotes a mixture ratio of 9:1 of nickel and platinum being applied to the semiconductor device. It is thus possible to determine an optimal film thickness ratio, i.e., an optimal mixture ratio, in order to minimize the contact resistance between the MOS transistor gate electrode and the wire to the gate electrode.

(Third Step)

Following is a description of a semiconductor device creation method that forms the nickel film and the platinum film with the optimal film thickness ratio that is determined by the evaluation process according to step S105.

In the present circumstance, the nickel target is employed to form a sputter film with a 9 nm thickness upon the MOS transistor 77. In the present circumstance, when employing the sputter film forming apparatus wherein the substrate and the target are positioned in a non-parallel manner, such as is depicted in FIG. 4, the forming of the film is performed while rotating the substrate, and the forming of the film terminates at a predetermined timing from a commencement of the forming of the film, wherein the substrate has rotated by 360 degrees×n+α, where n is a natural number, including 0, and −10 degrees<α<10 degrees. A level 9 nm nickel film is thus created.

The platinum target is next employed to sputtering form a film with a 1 nm thickness. In the present circumstance, when employing the sputter film forming apparatus wherein the substrate and the target are positioned in a non-parallel manner, such as is depicted in FIG. 4, the forming of the film is performed while rotating the substrate, and the forming of the film terminates at a predetermined timing from a commencement of the forming of the film wherein the substrate has rotated by 360 degrees×n+α, where n is a natural number, including 0, and −10 degrees<α<10 degrees. A level 1 nm platinum film is thus created. A thin film stack, i.e., the electronic device, wherein the level 9 nm nickel film and the level 1 nm platinum film is thus completed.

It is to be understood that the condition wherein the third step may be used is not restricted thereto, and a specification such as the film thickness distribution would be permissible, provided that the condition satisfies the specification that is treated as being necessary herein.

The apparatus that is used in the third step for the manufacture of the electronic device is not restricted to the apparatus that is depicted in FIG. 4, and it would be permissible to use apparatus that is capable of creating a film upon a target substrate wherein the film to be thus created incorporates a specification that is required in the manufacture of the electronic device to be created. The specification that is required would be such as the longitudinal film thickness distribution upon the substrate, a distribution of the resistance value, or a density of impurity, for instance. It would be permissible for the apparatus that is capable of being used in the manufacture of the electronic device other than the apparatus that is depicted in FIG. 4 to be, specifically, a sputtering film forming system wherein the target is installed parallel to the substrate, for instance. It would be permissible for the substrate either to rotate, or not to rotate, during the forming of the film, provided that the specification that is required is satisfied. While it would be desirable for the apparatus that is capable of being used in the third step in the manufacture of the electronic device to be capable of using the sputtering film forming system from a standpoint of a difference in a film property, it would nonetheless be permissible to use an apparatus that satisfies the specification to be required, such as per the preceding, and it would thus be possible to use an apparatus that incorporates a different film forming mechanism, such as ALD or CVD. Put another way, it would also be possible to use an apparatus of a protocol such as ALD or CVD, in order to manufacture the semiconductor device according to the third step, employing the condition that is determined in the second step, following the forming in the first step by the sputtering, as previously described herein, of the thin film stack that incorporates the inclined distribution, employing the target that is installed at an incline to the substrate.

It is possible to significantly improve throughput and efficiency in mass production by manufacturing the electronic device via the process of evaluating the inclined film thickness and creating the thin film according to the condition thus evaluated. Put another way, using the inclined film facilities evaluating a plurality of film thicknesses with a single thin film, which, in turn, facilitates creating a different film for each different film thickness, and omitting a time and effort that would be involved in the evaluation thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefits of Japanese Patent Application No. 2007-116319, filed Apr. 26, 2007, and Japanese Patent Application No. 2008-099786, filed Apr. 7, 2008, which are hereby incorporated by reference herein in their entirety.

What is claimed is:

1. A sputtering film forming method for forming a deposition film whose film thickness is distributed at a predetermined inclination rate in one direction of a fully exposed surface of a substrate, said method comprising the steps of:
   positioning a target at an incline to the fully exposed surface of the substrate upon which a film is to be formed, and forming the film having the predetermined inclination rate in the one direction of the fully exposed surface of the substrate upon the fully exposed surface of the substrate while the substrate is rotated about a normal axis to the fully exposed surface of the substrate; and
   terminating the forming of the film at a predetermined timing from a commencement of the forming of the film, wherein the forming of the film is terminated, when the substrate has rotated by 360 degrees×n+180 degrees+α, where n is a natural number, including 0, and −10 degrees<α<10 degrees.

2. The sputtering film forming method according to claim 1, wherein the α is α=0.

3. An electronic device manufacturing method, comprising the steps of:
   a first step of forming a stacked body by stacking
      a first deposition film whose film thickness is distributed at a predetermined inclination rate in one direction of a fully exposed surface of a substrate by positioning a target at an incline to the fully exposed surface of the substrate on which a film is to be formed, forming the film upon the fully exposed surface of the substrate on which the film is to be formed while the substrate is rotated about a normal axis to the fully exposed surface of the substrate, and terminating the forming of the film at a predetermined timing when the substrate has rotated by 360 degrees×n+180 degrees +α from a commencement of the forming of the film, where n is a natural number, including 0, and −10<α<10 degrees, and
      a second deposition film whose film thickness is distributed at a predetermined inclination rate in one direction of the surface of the substrate on which the first deposition film is formed by commencing forming of the second deposition film on the first deposition film at a predetermined timing when the substrate has rotated by 180 degrees in a circumferential direction from a position corresponding to the commencement of the forming of the first deposition film and terminating the forming of the second deposition film at a predetermined timing when the substrate has rotated by 360 degrees×n+180 degrees +α from a commencement of the forming of the second deposition film, where n is a natural number, including 0, and −10<α<10 degrees;
   a second step of evaluating a plurality of portions of the stacked body formed in the first step to determine a film thickness ratio of the first deposition film and the second deposition film; and
   a third step of manufacturing an electronic device according to the film thickness ratio determined in the second step.

4. The electronic device manufacturing method according to claim 3, wherein the α is α=0.

5. A sputtering system configured to position a target at an incline to a fully exposed surface of a substrate on which a film is to be formed, and to form the film having a predetermined inclination rate in one direction of the fully exposed surface of the substrate upon the fully exposed surface of the substrate while the substrate is rotated about a normal axis to the fully exposed surface of the substrate,
   the sputtering system comprising:
   a rotating drive unit configured to rotate the substrate;
   an angle of rotation detection unit configured to detect an angle of rotation of the rotating drive unit; and
   a control unit configured to interrupt a film forming operation, when a rotation of 360 degrees×n+180 degrees+α from a commencement of the forming of the film, where n is a natural number, including 0, and −10 degrees<α<10 degrees, is detected by the angle of rotation detection unit.

6. The sputtering system according to claim 5, wherein the α is α=0.

7. A sputtering system configured to position a target at an incline to a fully exposed surface of a substrate on which a film is to be formed, and to form the film having a predetermined inclination rate in one direction of the fully exposed surface of the substrate upon the fully exposed surface of the substrate while the substrate is rotated about a normal axis to the fully exposed surface of the substrate,
   the sputtering system comprising:
   a rotating drive unit configured to rotate the substrate;
   a shutter configured to be positioned between the target and the substrate;
   an open and close drive unit configured to drive an open and close of the shutter;
   an angle of rotation detection unit configured to detect an angle of rotation of the rotating drive unit; and
   a control unit configured to drive the open and close drive unit to close the shutter, when a rotation of 360 degrees× n+180 degrees +α from a commencement of the forming of the film, where n is a natural number, including 0, and −10 degrees <α<10 degrees, is detected by the angle of rotation detection unit.

8. The sputtering system according to claim 7, wherein the α is α=0.

9. The sputtering film forming method according to claim 1, wherein the forming of the film is terminated by a close operation of a shutter mechanism between the target and the substrate.

* * * * *